(12) United States Patent
Alcott et al.

(10) Patent No.: US 7,928,413 B2
(45) Date of Patent: Apr. 19, 2011

(54) ION IMPLANTERS

(75) Inventors: Gregory Robert Alcott, West Sussex (GB); Adrian Murrell, West Sussex (GB)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 12/003,962

(22) Filed: Jan. 3, 2008

(65) Prior Publication Data
US 2009/0173894 A1  Jul. 9, 2009

(51) Int. Cl.
*G21K 5/00* (2006.01)
(52) U.S. Cl. ............ 250/492.21; 250/492.3; 250/492.23
(58) Field of Classification Search ............... 250/492.21
See application file for complete search history.

(56) References Cited

U.S. PATENT DOCUMENTS

| | | | |
|---|---|---|---|
| 4,754,200 A | 6/1988 | Plumb et al. | |
| 4,914,305 A * | 4/1990 | Benveniste et al. | 250/492.3 |
| 5,432,352 A * | 7/1995 | van Bavel | 250/492.21 |
| 5,747,936 A | 5/1998 | Harrison et al. | |
| 6,489,622 B1 | 12/2002 | Chen et al. | |
| 7,326,941 B2 * | 2/2008 | Chen et al. | 250/492.21 |
| 7,547,899 B2 * | 6/2009 | Vanderpot et al. | 250/492.21 |

FOREIGN PATENT DOCUMENTS

| | | |
|---|---|---|
| EP | 0104818 | 4/1984 |
| JP | 7211497 | 8/1995 |

OTHER PUBLICATIONS

English Abstract of JP 7211497.

* cited by examiner

*Primary Examiner* — Phillip A Johnston
(74) *Attorney, Agent, or Firm* — Boult Wade Tennant

(57) ABSTRACT

The present invention relates to components in an ion implanter that may see incidence of the ion beam, such as a beam dump or a beam stop. Such components will be prone to the ions sputtering material from their surfaces, and sputtered material may become entrained in the ion beam. This entrained material is a source of contamination. The present invention provides an ion implanter comprising power supply apparatus and an ion-receiving component. The component has an opening that receives ions from an ion beam such that ions strike an internal surface. The power supply apparatus is arranged to provide an electrical bias to the internal surface to decelerate the ions prior to their striking the surface, thereby mitigating the problem of material being sputtered from the surface.

9 Claims, 4 Drawing Sheets

ION IMPLANTERS

FIELD OF THE INVENTION

The present invention relates to components in an ion implanter that may see incidence of the ion beam, such as a beam dump or a beam stop.

BACKGROUND OF THE INVENTION

Ion implanters are used in the manufacture of semiconductor devices and other materials. In such ion implanters, semiconductor wafers or other substrates are modified by implanting atoms of a desired species into the body of the wafer, for example to form regions of varying conductivity.

Ion implanters are well known and generally conform to a common design as follows. An ion source generally comprises an arc chamber in which a hot plasma is generated. The plasma will contain ions of a desired species to be implanted.

An extraction lens assembly produces an electric field that extracts ions from the ion source and forms a mixed beam of ions. Only ions of a particular species are usually required for implantation in a wafer or other substrate, for example a particular dopant for implantation in a semiconductor wafer. The required ions are selected from the mixed ion beam that emerges from the ion source by using a mass analysing magnet in association with a mass-resolving slit. By setting appropriate operational parameters on the mass-analysing magnet and the ion optics associated therewith, an ion beam containing almost exclusively the required ion species emerges from the mass-resolving slit. The ions travel along a flight tube as they pass through the mass-analysing magnet.

The ion beam is transported along a beam line to a process chamber where the ion beam is incident on a substrate held in place in the ion beam path by a substrate holder. The substrate may be a semiconductor wafer.

The various parts of the ion implanter are operated under the management of a controller, typically a suitably trained person, a programmed computer, or the like. A more detailed description of an ion implanter of this general type can be found in U.S. Pat. No. 4,754,200.

Ions may strike some components within the ion implanter relatively frequently (other than the substrate to be implanted). For example, ions with a large mass-to-charge ratio will not be deflected sufficiently by the mass-resolving magnet to pass through the mass-resolving slit. As a result, a beam dump may be provided to adsorb such ions. These ions striking the beam dump may cause sputtering of material. Care must be taken though, as material sputtered from the beam dump may become entrained within the ion beam and so contaminate the substrate.

In addition, there are times when the ion beam may be dumped into the beam dump on purpose. For example, instability in the ion beam may require that implantation of a wafer be stopped as quickly as possible. One way of achieving this is to switch off the mass-analysing magnet. With the magnet switched off, the ions merely follow a straight path rather than the usual curved path through the flight tube. The beam dump is positioned to absorb the ion beam when it is dumped in this way. Such a beam strike of the whole beam is likely to sputter more material. Although the material can no longer become entrained within the ion beam, there remains a problem in that the beam dump often has line of sight to the substrate. Consequently, material sputtered from the beam dump may still contaminate the substrate.

A further example of a component that frequently sees beam strike is the beam stop that resides downstream of the substrate. The ion beam may strike the beam stop when the substrate is moved away from the ion beam path, e.g. during mechanical scanning of the wafer during implants with a spot beam.

Unwanted material that has been sputtered from components such as a beam dump may travel to the substrate and subsequently the material may strike the substrate causing contamination or even damage to the devices being formed on the substrate. Moreover, sputtered material may adhere to another surface within the ion implanter. Surfaces adjacent to the ion beam are the most prone to receiving such deposits. As the amount of material deposited accumulates, the chances of the deposits delaminating to form flakes or particles increases. These flakes or particles frequently detach from their host surface and may become entrained in the ion beam. As a result, the flakes or particles contain sputtered material that still ultimately reaches the substrate.

SUMMARY OF THE INVENTION

Against this background, and from a first aspect, the present invention resides in a method of operating an ion implanter comprising: producing an ion beam; receiving ions from the ion beam in a component having an entrance opening and an internal surface for absorbing ions that have passed through the entrance opening; providing an electrical bias on the internal surface so as to decelerate the ions prior to them striking the internal surface.

From a second aspect the present invention resides in an ion implanter comprising power supply apparatus and an ion-receiving component with an entrance opening providing line of sight to an internal surface. The component is arranged to receive ions from an ion beam through the entrance opening such that ions strike the internal surface. The power supply apparatus is arranged to provide an electrical bias to the surface to decelerate the ions prior to their striking the surface.

Biasing the surface in this way is advantageous in that it reduces the energy of the ions before they strike the internal surface. Thus, with their energy reduced, the ions will pose less of a problem in sputtering material from the surface. Preferably, the power supply apparatus is arranged to bias the internal surface to be at substantially the same potential as the ion beam.

The component may further comprise an array of electrodes disposed between the surface and entrance opening. This allows further electrical control. For example, the array of electrodes may comprise one or more upstream electrodes disposed adjacent the opening. The one or more upstream electrodes may be electrically biased by the power supply to be at substantially the same potential as the ion beam. This is beneficial in that it stops ions within the ion beam travelling past the beam dump, but not travelling into the beam dump, from seeing the potential of the surface. Thus, such ions are not disturbed in their flight by the repulsive electrical field exerted by the surface.

In addition, or as an alternative, the array of electrodes may further comprise one or more downstream electrodes positioned adjacent the surface. The one or more downstream electrodes may be electrically biased to repel electrons liberated from the surface. This suppresses these electrons that may otherwise neutralise ions in the beam.

The ion receiving component may be a beamstop or it may be part of a flight tube of a mass resolving analyser. The ion receiving component may be used elsewhere in an ion implanter, preferably in positions where it may receive ions, either the ion beam itself or ions that are lost from the ion beam.

Other preferred, but optional features, are to be found in the appended claims.

BRIEF DESCRIPTION OF THE DRAWINGS

In order that the present invention may be better understood, a preferred embodiment will now be described with reference to the accompanying drawings, in which.

DETAILED DESCRIPTION OF THE INVENTION

Figure 1:
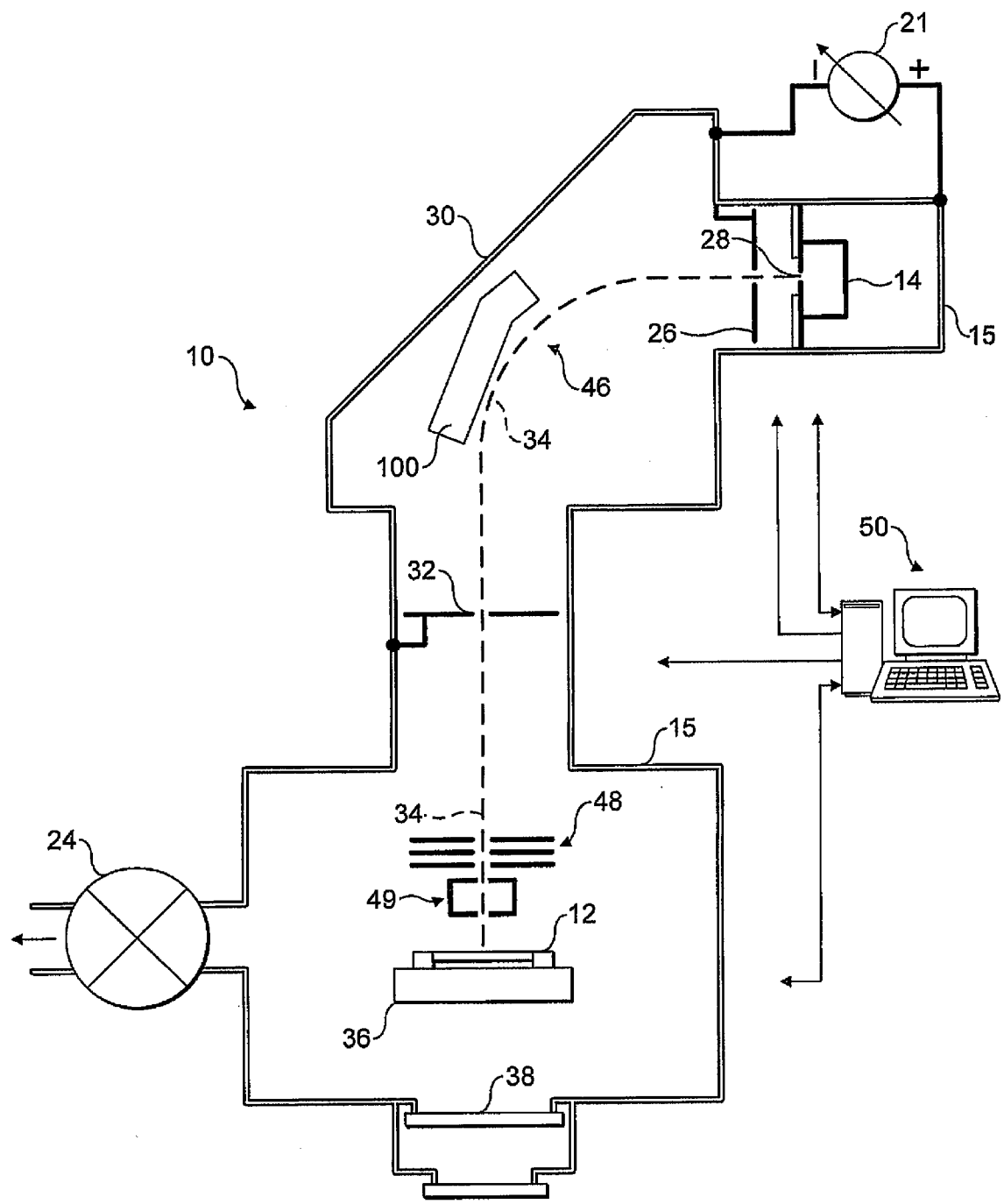
FIG. 1 is a schematic representation of an ion implanter.

In order to provide a context for the present invention, an exemplary application is shown in FIG. 1, although it will be appreciated this is merely an example of an application of the present invention and is in no way limiting.

FIG. 1 shows an ion implanter 10 for implanting ions in semiconductor wafers 12 that may be used in accordance with the present invention. The ion implanter 10 comprises a vacuum chamber 15 pumped through valve 24. Ions are generated by ion source 14 and are extracted by an extraction lens assembly 26 to form an ion beam 34. In this embodiment this ion beam 34 is steered and shaped through the ion implanter 10 such that the ion beam 34 passes through a mass analysis stage 30. Ions of a desired mass are selected to pass through a mass resolving slit 32 and then conveyed onward along an ion beam path 34 towards the semiconductor wafer 12. In this embodiment, the ions are decelerated before reaching the semiconductor wafer 12 by deceleration lens assembly 48 and pass through a plasma flood system 49 that acts to neutralise the ion beam 34.

Ions formed within the ion source 14 are extracted through an exit aperture 28 using a negatively-biased (relative to ground) extraction electrode 26. A potential difference is created between the ion source 14 and the following mass analysis stage 30 by a power supply 21 such that the extracted ions are accelerated. The ion source 14 and mass analysis stage 30 are electrically isolated from each other by an insulator (not shown).

The mixture of extracted ions are then passed through the mass analysis stage 30 so that the mixture passes around a curved path through a flight tube 46 under the influence of a magnetic field. A beam dump 100 resides within the flight tube 46. The radius of curvature traveled by any ion is determined by its mass, charge state and energy. The magnetic field is controlled so that, for a set beam energy, only those ions with a desired mass-to-charge ratio energy exit along a path coincident with the mass-resolving slit 32.

The ion beam 34 is then transported to the wafer 12 to be implanted (or other substrate) or to a beam stop 38 when there is no wafer 12 in the target position. Before arriving at the wafer 12 or beamstop 38, the ions may be decelerated using a deceleration lens assembly like that shown at 48 positioned between the mass analysis stage 30 and upstream of the wafer 12. The deceleration lens assembly 48 is followed by a plasma flood system 49 that operates to produce a flood of electrons that are available to the semiconductor wafer 12 to neutralise the effect of the incident positive ions.

The semiconductor wafer 12 is mounted on a wafer holder 36, wafers 12 being successively transferred to and from the wafer holder 36 for serial implantation. Alternatively, parallel processing may be used where many wafers 12 are positioned on a carousel 36 that rotates to present the wafers 12 to the incident ion beam 34 in turn.

A controller is shown at 50 that comprises a suitably programmed computer. The controller 50 is provided with software for managing operation of the ion implanter 10.

Figure 2:
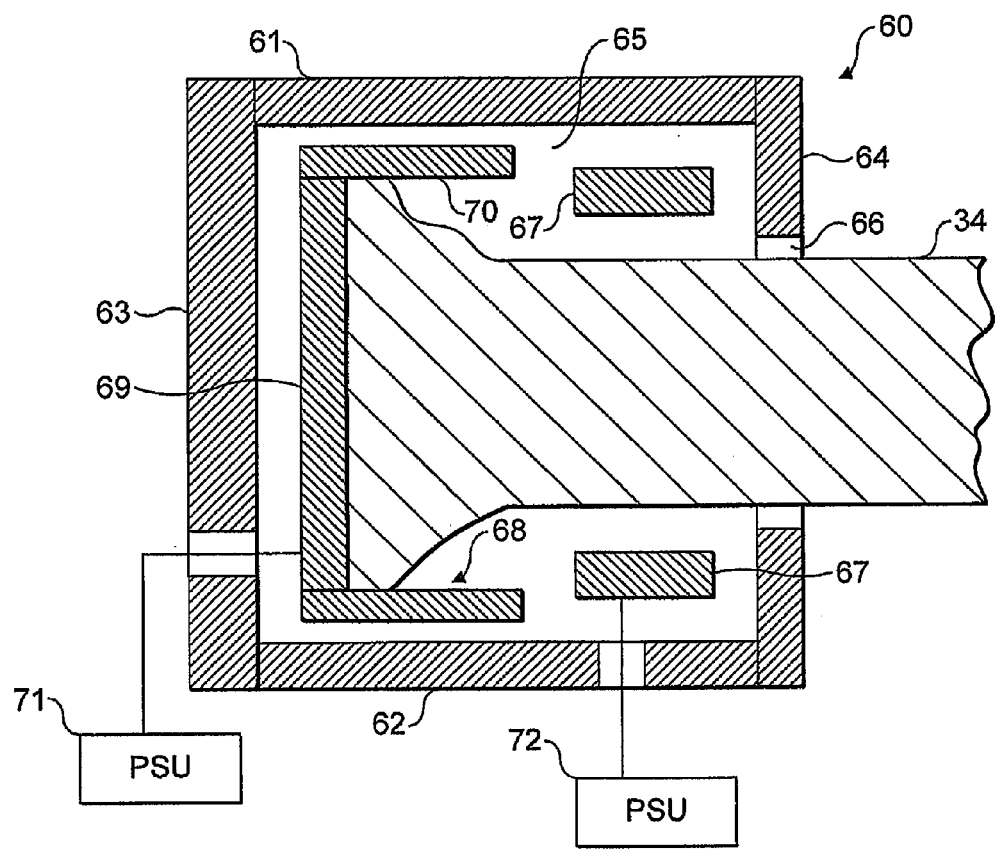
FIG. 2 is a cross-section through a first embodiment of a beam dump of the ion implanter of FIG. 1.

A first embodiment of a ion implanter component according to the present invention is shown in FIG. 2. The component shown is a beam dump 60 that may be placed at various location within an ion implanter, such as the one shown in FIG. 1, to receive the ion beam. For example, the beam dump 60 may be used as a beamstop 38 positioned downstream of the wafer 12, so as to receive the ion beam 34 when the wafer 12 is not in the implant position. As another example, the beam dump 60 may be used in a flight tube 46 so as to receive the ion beam 34 when the magnet of the mass analyser 30 is switched off. Also, such a beam dump 60 may be used to receive ions that do not follow the ion beam path 34 through the flight tube 46, i.e. to receive ions not having the desired mass to charge ratio.

The beam dump has a generally box-like shape defined by a top 61, a bottom 62, a back wall 63, a front wall 64 and a pair of end walls 65 (only one of which is visible in FIG. 2). The front wall 64 is provided with a central aperture 66 that penetrates through the front wall 64.

The beam dump 60 is positioned such that the aperture 66 faces the ion beam 34, so as to receive the ion beam 34 as shown in FIG. 2. The ion beam 34 passes through the aperture 66 and passes a pair of opposed suppression electrodes 67 positioned just beyond the aperture 66. The purpose of the suppression electrodes will be described below. Once past the suppression electrodes 67, the ion beam 34 enters and strikes a cup 68 comprising a base 69 and a cylindrical wall 70. The cup 38 need not be cylindrical, but could be other shapes. The cup 38 is electrically biased, as will now be described.

The ion beam 34 has a beam energy equal to the potential set on the ion source 14, e.g. if the ion source 14 is set at +10 kV, ions within the ion beam will typically have an energy of 10 keV. Such high-energy beams 34 are commonly used within ion implanters 10 to reduce the problems of space charge blow-up. Ions striking the cup 68 of the beam dump 60 causes sputtering of material and the problem of material being sputtered from the beam dump 100 worsens the greater the energy of the incident ions. This problem is mitigated by using a power supply unit 71 to place a potential on the cup 68 that decelerates ions in the ion beam 34 before they strike the cup 68.

The potential set on the cup 68 is matched to the beam energy and so chosen to be at or preferably just below the potential of the ion source 14. For example, the cup 68 may be biased to be +9.9 kV. In this way, the incoming ions are decelerated to near-zero energy prior to striking the cup 68. Thus, the problem of material being sputtered from the cup 68 is lessened. An alternative to using a power supply unit 71 to provide the decelerating potential is to connect electrically the cup 68 to the ion source 14, such that both are at the same potential. Setting the cup 68 to be at the same potential as the ion source 14 may cause some ions to be reflected by the cup 68, hence a slightly lower potential is preferred.

As shown in FIG. 2, the decelerating ion beam 34 has an ever-increasing tendency to blow-up due to space charge effects.

A power supply unit 72 is used to set a potential on the suppression electrodes 67. Power supply units 71 and 72 may be combined if desired. The suppression electrodes 114 are set at a high negative potential, for example −5 kV. This is to suppress electron travel in either direction. In particular, the suppression electrodes 114 suppress any electrons liberated from the cup 68 from travelling back out of the beam dump 60. Such an electron beam may otherwise cause damage within the ion implanter 10. For example, the electron beam may cause heating of any part it impacts and this can be extreme enough to cause melting. Obviously, the potential for any electron beam striking the wafer 12 to cause serious damage is considerable. Electron impact may also cause x-ray emission.

Figure 3:
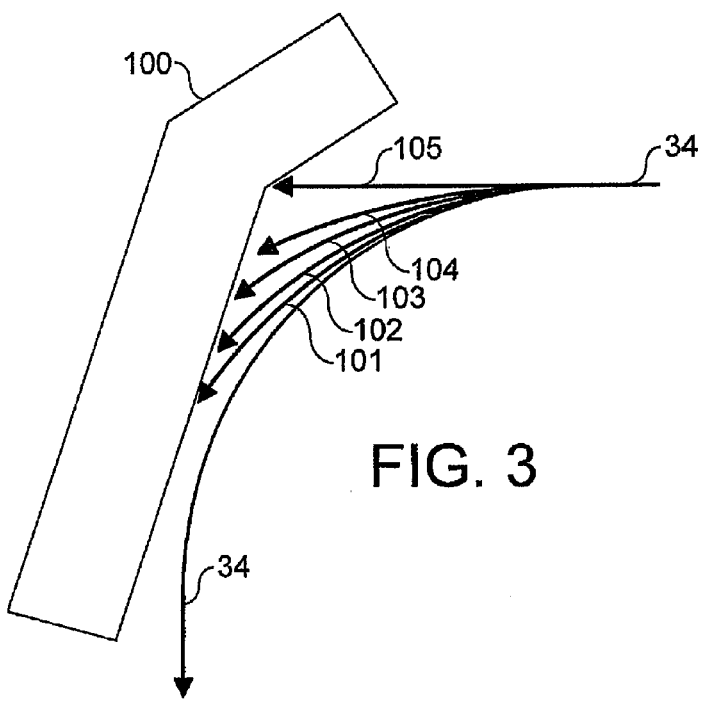
FIG. 3 is a schematic representation of a beam dump within a flight tube of the ion implanter of FIG. 1.

FIG. 3 shows a representation of the mass analyser 30 of FIG. 1, along with the path 34 of ions through a flight tube 46 defined by the mass analyser 30. The solid line 34 shows the path of ions having the desired mass-to-charge ratio and describes a smooth quarter-turn through the mass analyser 30. While the beam dump 60 of FIG. 2 may be used in this flight tube 46, FIG. 3 shows an alternative embodiment of a beam dump 100. The beam dump 100 is provided for ions having a greater mass-to-charge ratio than desired, and for instances when the ion beam 34 is dumped. Ions having a greater mass-to-charge ratio than desired may strike the beam dump 100 as shown at 101-104. The path that the ion beam follows when the magnet of the mass analyser 30 is switched off is shown at 105. Ions having a lesser mass-to-charge ratio than desired will turn inwardly from the ion beam path 34. Although not shown, a further beam dump 60, 100 may be provided on the inner radius of the path 34 to receive such lighter ions.

Ions that strike the beam dump 100 may sputter material. Typically, beam dump 100 will be made from graphite and so there is a danger that graphite will become entrained in the ion beam 34 as it passes through the mass analyser 30. This entrained material may be deposited on nearby parts, causing deposited coatings that can then flake off, generating particulates. These particulates can then be transported to the wafer 12, causing contamination.

Figure 4:
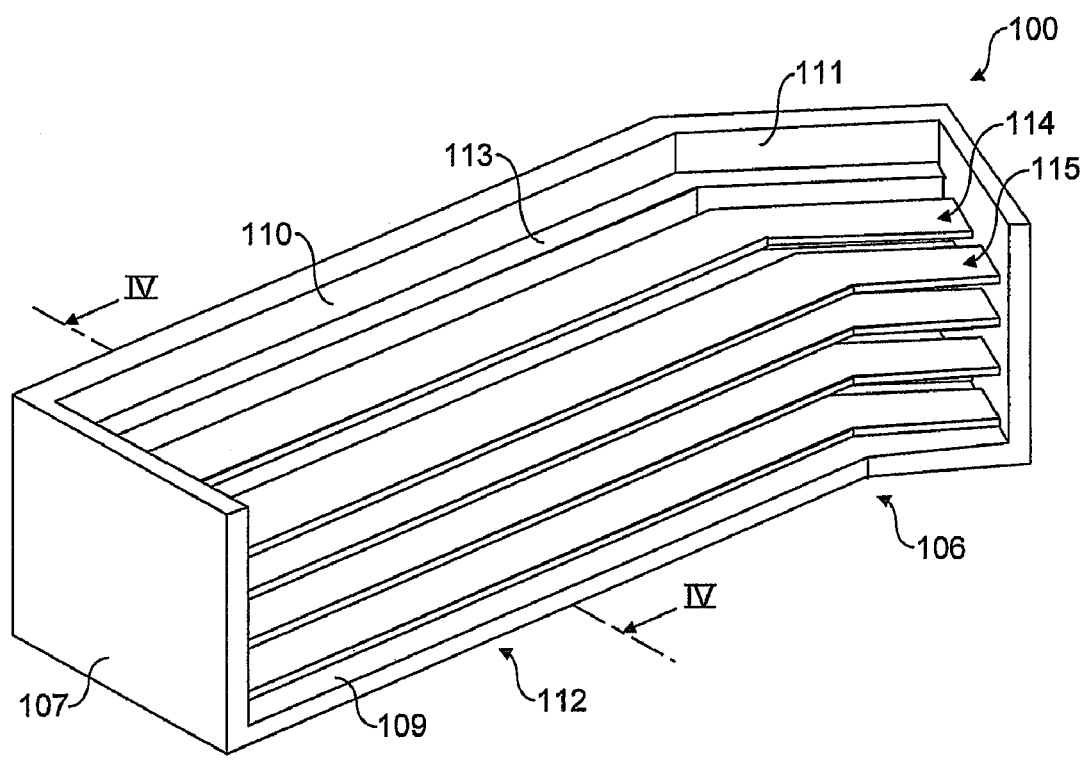
FIG. 4 is a perspective view of a beam dump according to a second embodiment of the present invention.
Figure 5:
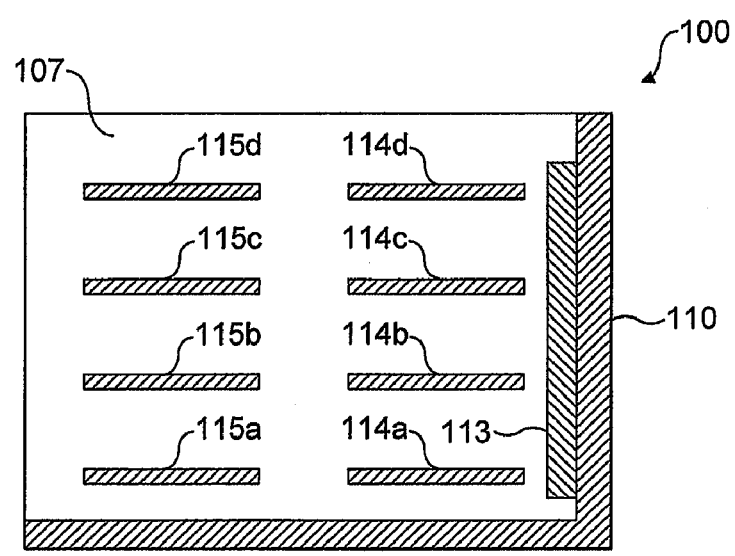
FIG. 5 is a section taken through line IV-IV of FIG. 4.
Figure 6:
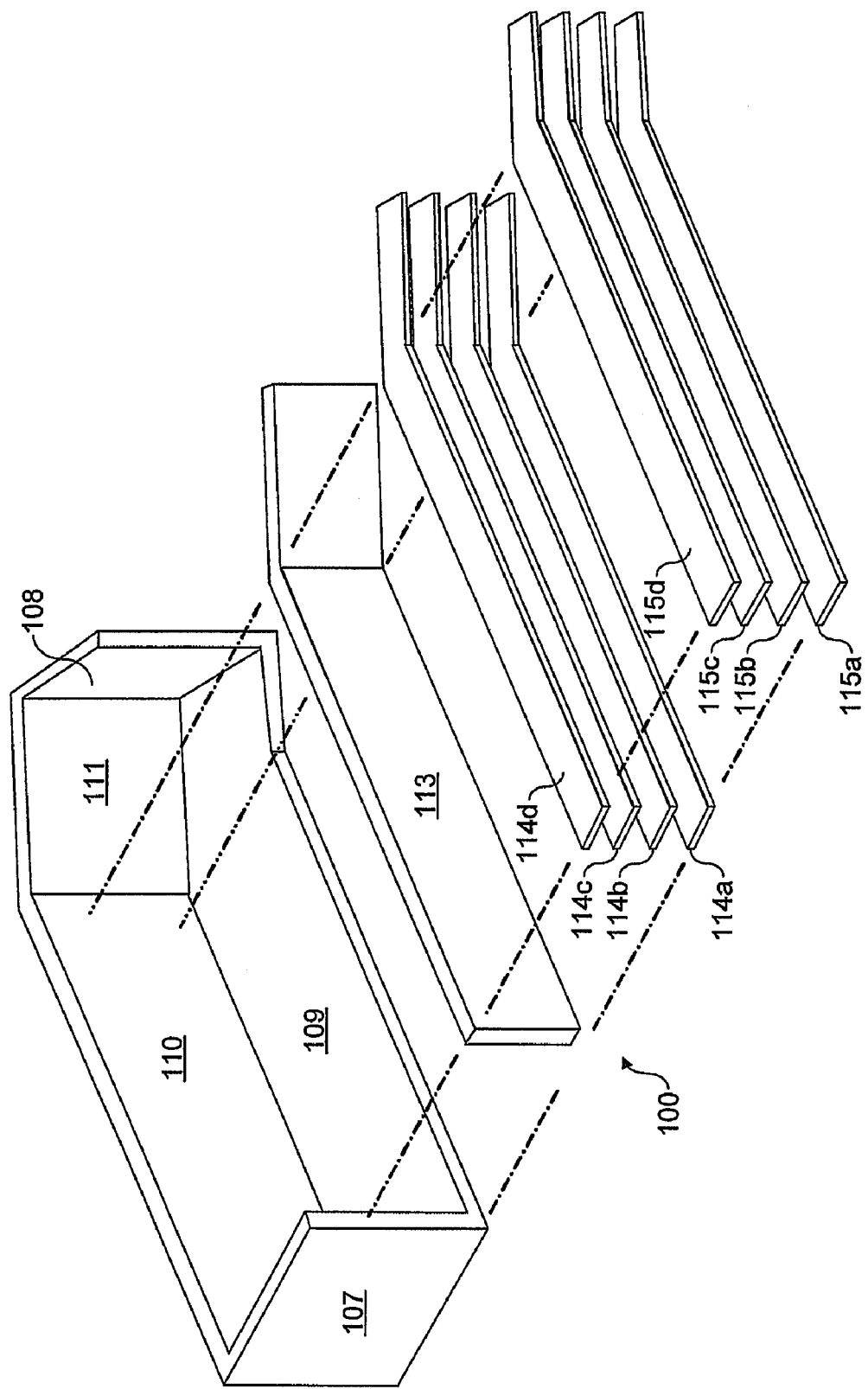
FIG. 6 is an exploded perspective view of the beam dump of FIG. 4.

FIGS. 4 to 6 show beam dump 100 in greater detail. The beam bump 100 is broadly box like and has a dog-legged shape 106. The beam dump 100 comprises side walls 107 and 108, a base 109 and two back walls 110 and 111. Thus, the beam dump 100 has an open front face entrance opening) 112 to allow entry of ions from the ion beam 34.

A graphite dump plate 113 is attached to the back walls 110 and 111 by any convenient means, e.g. screws, bolts, etc. The dump plate 113 has the same dog-leg shape to conform to the shape of the back walls 110-111. Sitting in front of the dump plate 113 within the beam dump 100 are two sets of electrodes 114 and 115. The electrodes may be made from tungsten, or other materials such a graphite, stainless steel, etc. Each set of electrodes 114-115 comprises four identical generally planar electrodes 114a-d and 115a-d that are arranged one above another. Each electrode 114a-d and 115a-d extends from one side wall 107 to the other side wall 108, and has the common dog-leg shape. The electrodes may be fixed in place in any convenient manner. Electrodes from each set are paired with one another, such that electrode 114a resides adjacent to electrode 115a, and so on. As the electrodes 114-115 extend from near top to near bottom of the beam dump 100, they effectively present a grill to ions entering the beam dump 100, i.e., their front edges face the entrance opening 112. How the electrodes 114-115 and the dump plate 113 are advantageously biased will now be described. For the sake of clarity, the power supplies for and the electrical connections to the electrodes 114-115 and dump plate 113 are not shown in FIGS. 4 to 6. Nonetheless, the person skilled in the art will readily identify many different ways of arranging the electrical connections and supplies.

As described above, the ion beam 34 has a beam energy equal to the potential set on the ion source 14, e.g. 10 keV The potential set on the dump plate 113 is matched to the beam energy and so chosen to be at or preferably just below the potential of the ion source 14, e.g. +9.9 kV. Hence, the incoming ions are decelerated to near-zero energy prior to striking the dump plate 113 and so the problem of material being sputtered from the dump plate 113 is lessened.

To ensure that the potential of the dump plate 113 is not seen by ions before they enter the beam dump 100, the potential set on the front set of electrodes 115 is the same as the surrounding beamline. This may be achieved most easily by linking the potential of the front set of electrodes 115 to that of the flight tube 46 or the surrounding parts. Ensuring that the potential of the dump plate 113 is not seen by ions before they enter the beam dump 100 is important from the point of view of ions within the ion beam 34 that have the desired mass-to-charge ratio, as they should pass through the mass analyser 30 undisturbed by stray electric fields.

The back set of electrodes 114 are used to suppress electron travel and so is set at a high negative potential (relative to the front set of electrodes 115), for example −2 kV. In particular, the back set of electrodes 114 suppresses any electrons liberated from the dump plate 113 from travelling back out of the beam dump 100. As described above, such an electron beam may otherwise cause damage within the ion implanter 10 or to the wafer 12.

As will be appreciated by the person skilled in the art, variations may be made to the above embodiment without departing from the scope of the invention defined by the claims.

For example, it will be realised that the terms front, back, sides and base used above are merely relative and that the beam dump 60, 100 may be used in any orientation. As a result, the terms may need to be changed according to the particular orientation of the beam dump 60, 100 chosen.

Various features of the beam dumps 60, 100 may be interchanged between the two designs. For example, one or more screening electrodes may be used in the beam dump 60 of FIG. 2: an array of electrodes akin to the front set of electrodes 115 of FIGS. 4 to 6 may be used, or either a single such electrode or pair of electrodes may be used. The screening electrodes should have a negative potential to suppress electron travel.

As another example, the cup 68 of the beam dump 60 of FIG. 2 may be used in place of the dump plate 113 of FIGS. 4 to 6. Such a cup 68 may be advantageous as it reduces the risk of the ion beam 34 missing the dump plate 113 (remembering that the ion beam 34 is prone to blow-up as it approaches the dump plate 113, in the manner shown in FIG. 2).

FIGS. 1 and 3 show an ion implanter 10 with a single beam dump 100 provided in the flight tube 46. However, two or more beam dumps 100 may be provided. For example, a series of beam dumps 60, 100 may be provided around the outer radius of the ion beam path 34 through the flight tube 46. The beam dumps 60, 100 may be progressively angled to follow approximately the ion beam path 34 through the flight tube 46.

Although, beam dumps 60, 100 have been described in use as a beamstop 38 and within a flight tube 46, the beam dumps 60, 100 may be used in any position within an ion implanter 10 that may receive ions from the ion beam 34.

The dog-leg design of the beam dump 100 of FIGS. 4 to 6 need not be used: as well as the linear beam dump 60, other shapes may be used.

The invention claimed is:

1. A method of operating an ion implanter comprising:
   producing an ion beam;
   receiving ions from the ion beam in a component having an entrance opening, an internal surface for absorbing ions that have passed through the entrance opening an array of electrodes comprising a first array of upstream electrodes disposed adjacent the entrance opening and a second array of downstream electrodes disposed between the first array and the internal surface, said electrodes being generally planar and positioned such that the side edges thereof face the entrance opening and provide a line of sight to an internal surface, wherein the component is arranged to receive ions from an ion beam through the entrance opening such that ions strike the internal surface; and
   providing an electrical bias on elements of the component.

2. The method of claim 1, further comprising providing a further electrical bias to one or more electrodes located adjacent the internal surface of the component such that the one or more electrodes repel electrons ejected from the internal surface.

3. The method of claim 1, further comprising providing a further electrical bias to one or more electrodes located adjacent the entrance opening so as to be at substantially the same potential as the ion beam as it passes the component.

4. An ion implanter comprising
   an ion-receiving component which defines an internal surface, an entrance opening, and an array of electrodes comprising a first array of upstream electrodes disposed adjacent the entrance opening and a second array of downstream electrodes disposed between the first array and the internal surface, said electrodes being generally planar and positioned such that the side edges thereof face the entrance opening and provide a line of sight to an internal surface, wherein the component is arranged to receive ions from an ion beam through the entrance opening such that ions strike the internal surface, and
   a power supply apparatus for providing an electrical bias to elements of the ion-receiving component.

5. The ion implanter of claim 4, wherein the power supply apparatus operates to bias the internal surface to be at substantially the same potential as the ion beam.

6. The ion implanter of claim 4, wherein the power supply apparatus operates to bias one or more upstream electrodes to be at substantially the same potential as the ion beam.

7. The ion implanter of claim 4, wherein the power supply apparatus operates to bias one or more downstream electrodes to repel electrons liberated from the internal surface.

8. The ion implanter of claim 4, wherein the power supply operates to bias the first array of upstream electrodes to be at substantially the same potential as the ion beam and to bias the second array of downstream electrodes to repel electrons liberated from the internal surface.

9. The ion implanter of claim 4, wherein the component is a beam dump or a beam stop.

\* \* \* \* \*